United States Patent
Yoneda

(10) Patent No.: US 7,199,514 B2
(45) Date of Patent: Apr. 3, 2007

(54) DISPLAY DEVICE WITH ANTI-REFLECTION STRUCTURE

(75) Inventor: Kiyoshi Yoneda, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 119 days.

(21) Appl. No.: 10/444,090

(22) Filed: May 23, 2003

(65) Prior Publication Data

US 2004/0041518 A1    Mar. 4, 2004

(30) Foreign Application Priority Data

May 24, 2002 (JP) ............................. 2002-150095
Aug. 9, 2002 (JP) ............................. 2002-233037

(51) Int. Cl.
*H01J 1/62* (2006.01)

(52) U.S. Cl. ...................... 313/501; 313/506; 313/504; 257/72; 257/88; 257/98

(58) Field of Classification Search ................ 313/500, 313/506–512; 315/169.3; 257/98
See application file for complete search history.

(56) References Cited

U.S. PATENT DOCUMENTS

| 4,820,619 A * | 4/1989 | Sanada et al. .............. 430/197 |
| 5,248,576 A * | 9/1993 | Yokoyama et al. .............. 430/7 |
| 5,831,693 A * | 11/1998 | McCartney et al. ........... 349/42 |
| 6,057,903 A * | 5/2000 | Colgan et al. .............. 349/139 |
| 6,114,715 A * | 9/2000 | Hamada ....................... 257/72 |
| 6,246,179 B1 * | 6/2001 | Yamada .................... 315/169.3 |
| 6,518,700 B1 * | 2/2003 | Friend et al. ............... 313/504 |
| 6,593,626 B2 * | 7/2003 | Hirabayashi et al. ........ 257/350 |
| 6,812,637 B2 * | 11/2004 | Cok et al. ................... 313/503 |
| 6,815,887 B2 * | 11/2004 | Lee et al. ................... 313/512 |
| 6,869,635 B2 * | 3/2005 | Kobayashi ................... 427/66 |
| 6,900,470 B2 * | 5/2005 | Kobayashi et al. ........... 257/88 |
| 6,911,772 B2 * | 6/2005 | Cok .......................... 313/501 |
| 6,936,960 B2 * | 8/2005 | Cok .......................... 313/506 |
| 2002/0140343 A1 * | 10/2002 | Hirabayashi ................ 313/493 |
| 2003/0067266 A1 * | 4/2003 | Kim et al. ................... 313/504 |
| 2003/0094615 A1 * | 5/2003 | Yamazaki et al. ............ 257/72 |
| 2003/0107314 A1 * | 6/2003 | Urabe et al. ................ 313/506 |
| 2003/0146695 A1 * | 8/2003 | Seki .......................... 313/506 |
| 2003/0151056 A1 * | 8/2003 | Yamazaki ................... 257/98 |
| 2003/0230972 A1 * | 12/2003 | Cok .......................... 313/504 |

* cited by examiner

*Primary Examiner*—Sikha Roy
(74) *Attorney, Agent, or Firm*—Morrison & Foerster LLP

(57) ABSTRACT

An organic EL element with an emissive layer and a second electrode layer is formed on a device glass substrate in an organic EL display device. The second electrode layer covers the emissive layer. An anti-reflection layer for preventing the reflection of light by the second electrode layer is formed on the device glass substrate except the region where the emissive layer is formed. Since this layer prevents the reflection of light by the second electrode layer, only the light from the emissive layer radiates outwards through the device glass substrate, improving the contrast of the organic EL display device.

3 Claims, 7 Drawing Sheets

DISPLAY DEVICE WITH ANTI-REFLECTION STRUCTURE

BACKGROUND OF THE INVENTION

1. Field of Invention

This invention relates to an electroluminescent display device, especially to the technology for improving the display quality of the electroluminescent display device with an electroluminescent element having an anode layer, an emissive layer and a cathode layer on an insulating substrate.

2. Description of Related Art

An electroluminescent (referred to as EL hereinafter) display devices with an EL element have been gathering attention as a display device substituting a CRT or an LCD.

FIG. 8 is a cross-sectional view of the configuration of a conventional organic EL display panel. A device glass substrate 1 has a display region, where a plurality of pixels with organic EL elements is formed, on the surface. Only one of each of the pixels of R, G, and B is shown in FIG. 8 for the sake of simplicity. Emissive layers 2R, 2C, 2B are formed on the device glass substrate 1 with a predetermined distance between themselves. Then, a cathode layer 3 extends over the entire display region of the device glass substrate 1 covering the emissive layers 2R, 2G and 2B. The cathode layer 3 is made of, for example, aluminum.

The device glass substrate 1 is attached to a sealing glass substrate 4 using a sealing resin 5 made of an epoxy resin. Although it is not shown in the figure, a desiccant layer for absorbing moisture is coated on the surface of the sealing glass substrate 4.

A driver circuit (not shown) in the figure drives the organic EL element in the organic EL panel with the configuration mentioned above. When the device is on, R, G and B lights generated from the emissive layers 2R, 2G, and 2B radiate outwards through the device glass substrate 1, which is either transparent or translucent, as shown in FIG. 8.

However, the cathode layer 3 made of aluminum reflects the light in the conventional organic EL panel, as shown in FIG. 8. The strong reflection of light by the cathode layer 3 makes the display region whitish, as the organic EL panel is viewed in a bright place, leading to the deterioration of the display contrast.

SUMMARY OF THE INVENTION

The invention provides an electroluminescent display device that includes an insulating substrate, a first electrode layer disposed over the insulating substrate, an emissive layer disposed over the first electrode, a second electrode layer covering the emissive layer, and an anti-reflection layer disposed over the insulating substrate and preventing light from reflecting from the first electrode layer or the second electrode layer.

The invention also provides an electroluminescent display device that includes an insulating substrate, a thin film transistor disposed over the insulating substrate, a planarization film disposed over the thin film transistor, a first electrode disposed over the planarization film, an emissive layer formed over the first electrode, a second electrode layer covering the emissive layer, and an anti-reflection layer disposed on the planarization film and preventing light from reflecting from the second electrode layer.

The invention further provides an electroluminescent display device that includes an insulating substrate, a first electrode layer disposed over the insulating substrate, an emissive layer disposed over the first electrode, a second electrode layer covering the emissive layer, and a colored layer disposed over the insulating substrate and having a same color as a light emitted from the emissive layer.

The invention also provides an electroluminescent display device that includes an insulating substrate and a electroluminescent element disposed over the insulating substrate. The electroluminescent element includes a first electrode layer disposed over the insulating substrate, an emissive layer disposed over the first electrode and a second electrode layer covering the emissive layer. The display device also includes a thin film transistor driving the electroluminescent element and a light-blocking layer preventing light from irradiating thin film transistor.

DETAILED DESCRIPTION OF THE INVENTION

Figure 1:
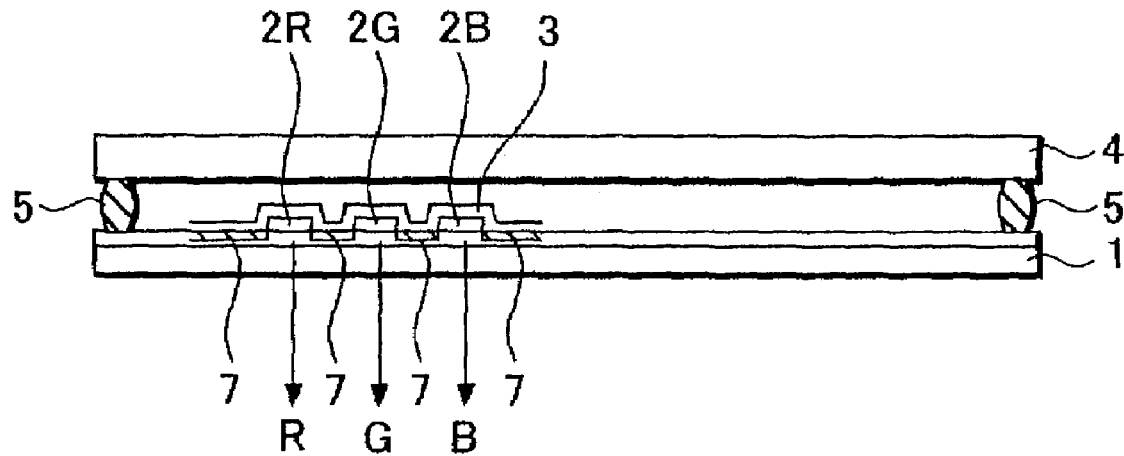
FIG. 1 is a cross-sectional view of an organic EL display panel of a first embodiment of this invention.
Figure 2:
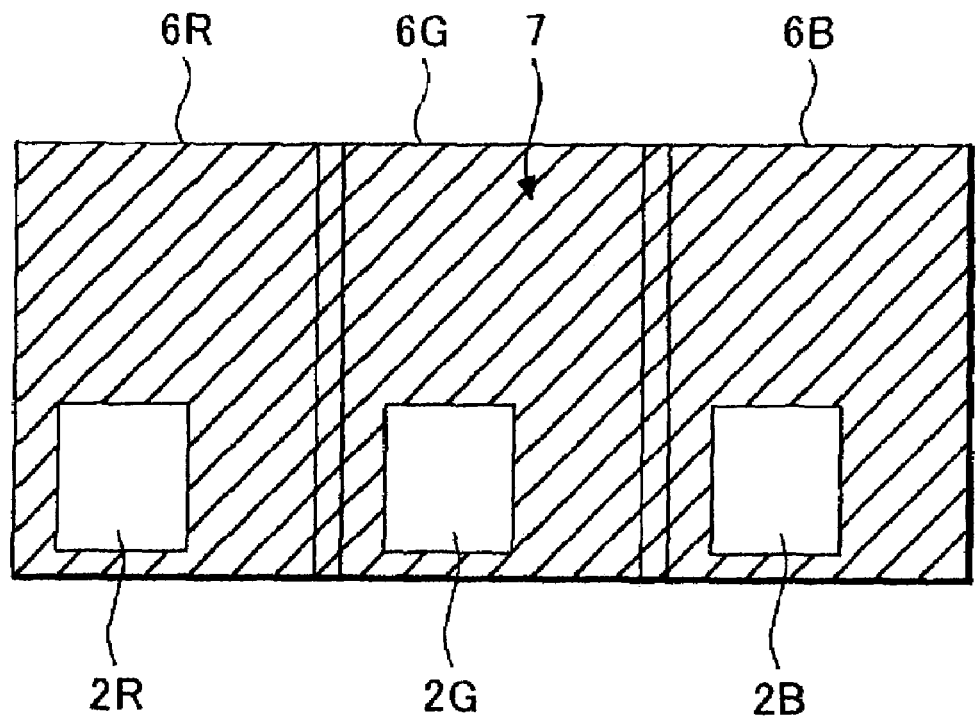
FIG. 2 is a plan view showing the configuration of the pixels of the first embodiment.
Figure 8:
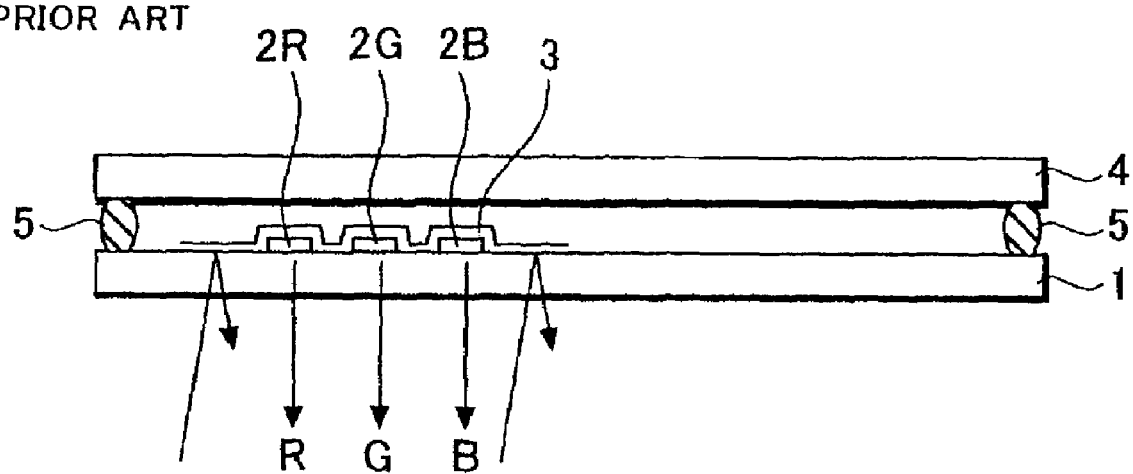
FIG. 8 is a cross-sectional view of a conventional organic EL display panel.

FIG. 1 is a cross-sectional view of an organic EL display panel of a first embodiment of this invention. The same reference numerals as in FIG. 8 are given to the corresponding components in FIG. 2. FIG. 2 is a plan view showing the configuration of the color pixels 6R, 6G, 6B corresponding to R, G and B, respectively.

A cathode layer 3 extends over the entire display region of a device glass substrate 1 covering emissive layers 2R, 2G and 2B, as shown in FIGS. 1 and 2. The cathode layer 3 is made of, for example, aluminum. An anti-reflection layer 7 for preventing the reflection of light by the cathode layer 3 is disposed above the device glass substrate 1 except the region, where the emissive layers 2R, 2G and 2B in pixels 6R, 6G, and 6B, respectively are formed.

Only three pixels 6R, 6G, and 6B are shown in the figure for the sake of convenience. However, the same configuration is applied to all the pixels of the display device. The anti-reflection layer 7 is formed on the device glass substrate 1 for preventing the reflection of light coming from the backside of the substrate. It may be formed anywhere between the device glass substrate 1 and the cathode layer 3.

The anti-reflection layer 7 should have a reflectivity of less than 50%. However, it is preferable for the anti-reflection layer to have the reflectivity of less than 20%.

Chromium oxide (CrO) is a suitable material for the anti-reflection layer 7. If the anti-reflection layer 7 is used as a black matrix for preventing the transmission of light for the area other than the region of the emissive layers 2R, 2G and 2B, the multiple-layer configuration with chromium oxide (CrO) and chrome (Cr) is suitable.

The anti-reflection layer is formed by depositing a CrO film with a thickness of 500 Å and a Cr film with a thickness of 1000 Å on the glass substrate. This layer has the reflectivity of about 12% against light with the wavelength of 450 nm. The reflectivity has the dependency on the wavelength of light, and it has the peak value (12%) around the wavelength of 450 nm.

Figure 3:
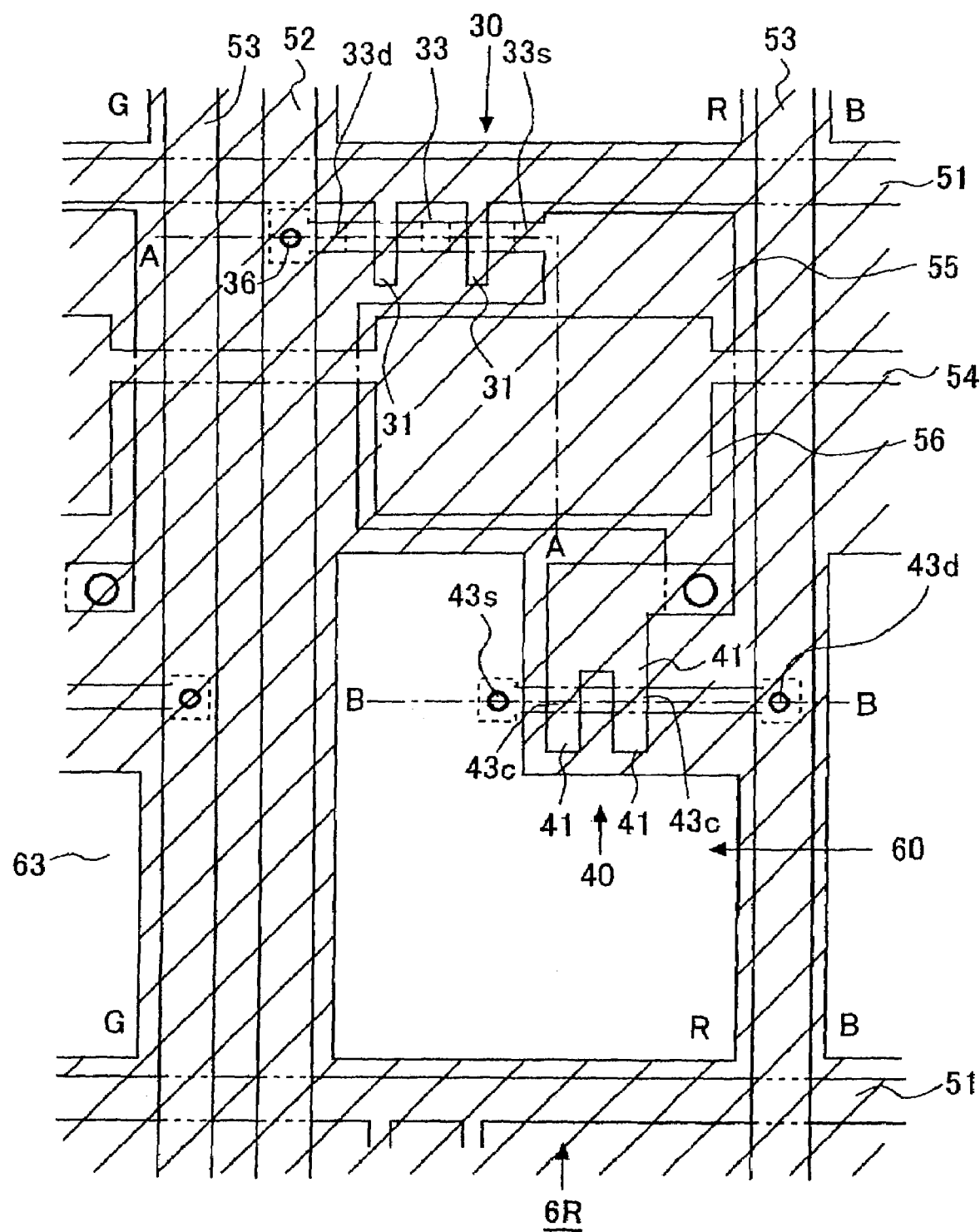
FIG. 3 is a plan view showing the area near the pixel of the organic EL display panel of the first embodiment.
Figure 4A:
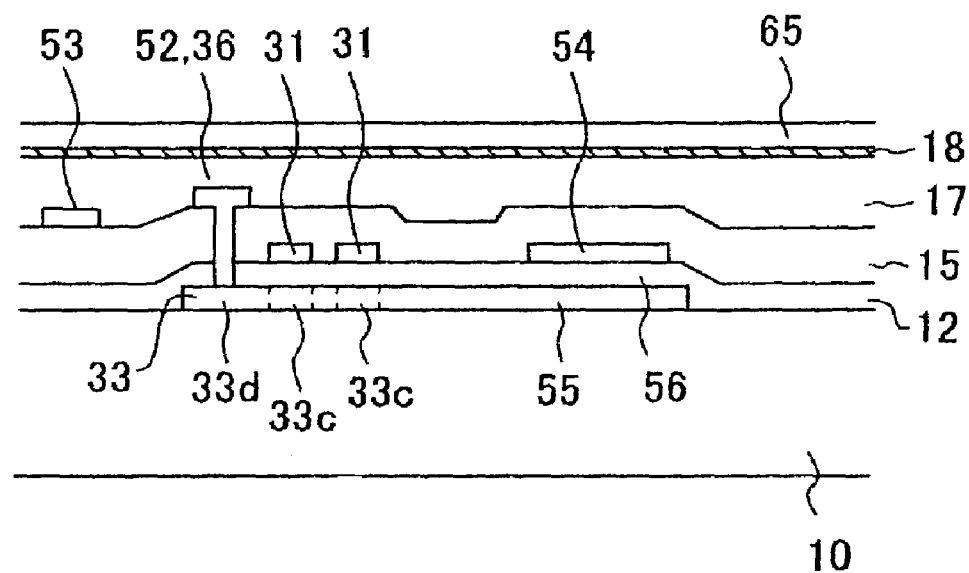
FIG. 4A is a cross-sectional view of the pixel of the organic EL display panel of the first embodiment.
Figure 4B:
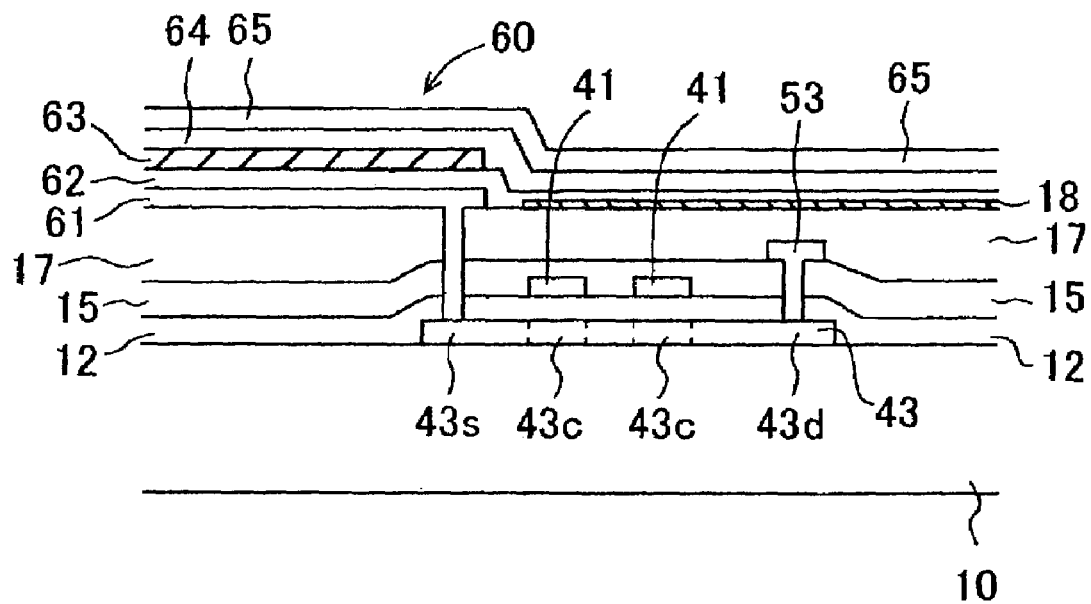
FIG. 4B is another cross-sectional view of the pixel of the organic EL display panel of the first embodiment.

The detailed explanation on this embodiment will be provided by referring to FIGS. 3, 4A and 4B. FIG. 3 is a plan view of the area near the pixel (corresponding to the pixel 6R above) of the organic EL display panel of the first embodiment. FIG. 4A is a cross-sectional view of the pixel along the A—A line, and FIG. 4B is a cross-sectional view of the pixel along B—B line in FIG. 3.

The pixel is formed in the area surrounded by a gate signal line 51 and a drain signal line 52, as shown in FIG. 3. A plurality of pixels are disposed in a matrix configuration. An organic EL element 60, which is a self light-emitting element, a switching TFT 30 for controlling the timing of supplying electric current to the organic 20 EL element 60, a driving TFT 40 for supplying electric current to the organic EL element 60, and a storage capacitance element 56 are disposed in the pixel. The organic EL element 60 includes an anode layer 61, an emissive layer 63 and the cathode layer 65. An anti-reflection layer 18 is disposed underneath of the cathode layer 65, as it is explained later.

The switching TFT 30 is disposed near the crossing of the signal lines 51 and 52. A source 33s of the TFT 30 works also as a capacitance electrode 55, which forms a capacitance with a storage capacitance electrode line 54, and is connected to a gate 41 of the TFT 40. A source 43d of the driving TFT 40 is connected to the anode layer 61 of the organic EL element 60, and a drain 43d of the TFT 40 is connected to a driving source line 53, which is a source of electric current supplied to the organic EL element 60.

The storage capacitance electrode line 54 is disposed parallel to the gate signal line 52. The storage capacitance electrode line 54 is made of chrome, and forms capacitance by accumulating electric charges between the storage capacitance electrode line 54 and the capacitance electrode 55, which is connected to the source 33s of the switching TFT 30, through a gate insulating film 12. The storage capacitance element 56 is formed for holding the voltage applied to a gate electrode 41 of the driving TFT 40.

The organic EL display device includes the TFTs and the organic EL element disposed sequentially on an insulating substrate 10, which is a substrate made of a glass or a synthetic resin, a conductive substrate, or a semiconductor substrate as shown in FIGS. 4A and 4B. When a conductive substrate or a semiconductor substrate is used as the insulating substrate 10, an insulating film such a $SiO_2$ film and/or SiN film should be disposed before forming the switching TFT 30, the driving TFT 40 and the organic EL element. Both TFTs have a top-gate configuration, where the gate electrode is disposed above an active layer through the gate insulating film. However, the TFT with a bottom-gate configuration, where the active layer is disposed on the gate electrode, may also be employed in this embodiment.

Next, the switching TFT 30 will be explained. An amorphous silicon film (referred to as a-Si film hereinafter) is formed through a CVD method on the insulating substrate 10 as shown in FIG. 4A. The a-Si film is irradiated by laser for re-crystallization from melt, forming a poly-crystalline silicon film (referred to as a p-Si film, hereinafter) as an active layer 33. This functions as the active layer 33. Channels 33c are formed in the active layer 33. The source 33s and the drain 33d are also formed at both sides of the channels 33c. Single layer or multiple layers of a $SiO_2$ film and a SiN film are formed on the p-Si film as the gate insulating film 12. Then, the gate signal line 51, also working as a gate electrode 31 and made of a metal with a high-melting point such as Cr and Mo, and the drain signal line 52 made of Al are disposed. Also, the driving source line 53, which is made of Al and is an electric source of the organic EL element 60, is disposed.

A $SiO_2$ film, a SiN film and a $SiO_2$ film are sequentially deposited to form the interlayer insulating film 15 on the entire surface of the gate insulating film 12 and the active layer 33. A drain electrode 36, which is formed by filling a contact hole formed in the interlayer insulating film 15 at the location corresponding to a drain 33d with a metal such as Al, is disposed, and a planarization film 17 made of organic resin for flattening the surface is formed on the entire surface.

Next, the driving TFT 40 for driving the organic EL element 60 will be explained. The a-Si film is formed on the insulating substrate 10 made of a quartz glass or a nonalkaline glass as shown in FIG. 4B. The a-Si film is irradiated by laser for forming a poly-crystalline silicon film functioning as an active layer 43. The gate insulating film 12, and the gate electrode 41 made of a metal with a high-melting point such as Cr and Mo are disposed on the active layer 43. Channels 43c are formed in the active layer 43. The source 43s and the drain 43d are also formed at both sides of the channels 43c.

A $SiO_2$ film, a SiN film and a $SiO_2$ film are sequentially deposited to form the interlayer insulating film 15 on the entire surface of the gate insulating film 12 and the active layer 43. The driving source line 53, which is connected to the driving source by filling a contact hole formed at the location corresponding to the drain 43d with a metal such as Al, is formed. Furthermore, the planarization film 17 made of an organic resin for flattening the surface is deposited on the entire surface.

A contact hole is formed in the planarization film 17 at the location corresponding to the source 43s. The anode layer 61 of the organic EL element 60, which is a transparent electrode made of ITO (Indium Tin Oxide) or IZO (Indium Zinc Oxide), making contact with the source 43s through the contact hole described above is formed on the planarization film 17. The anode layer 61 is disposed for each of the display pixels, forming an island The organic EL element 60 includes the anode layer 61 made of the transparent electrode such as ITO, a hole transportation layer 62 having a first hole transportation layer made of MTDATA (4,4-bis(3-mathylphenylphenylamino) biphenyl) and a second hole transportation layer made of TPD (4,4,4-tris (3-methylphenylphenylamino) triphenylanine), an emissive layer 63 made of Bebq2 (bis (10-hydroxybenzo[h]quinolinato)beryllium) having quinacridone derivative, an electron transportation layer 64 made of Bebq2, and the cathode layer 65 made of either magnesium-indium alloy, aluminum, or aluminum alloy.

The cathode layer 65 covers the emissive layer 63 extending on the entire surface of the pixel region. The anti-reflection layer 18 made of chromium oxide is formed by sputtering on the planarization film 17 located under the cathode layer 65. The anti-reflection layer 18 is not formed in the layer under the emissive layer 63.

The holes injected from the anode layer 61 and the electrons injected from the cathode layer 65 are re-combined in the emissive layer of the organic EL element 60, exciting organic molecules of the emissive layer. When the excited molecules are inactivated due to radiation, light is emitted from the emissive layer, and light then reaches outside from the transparent anode layer 61 and the insulating substrate 10, which is either transparent or translucent.

Since the anti-reflection film 18 is formed in this embodiment, the reflection of light by the cathode layer is prevented, improving the display contrast.

Figure 5A:
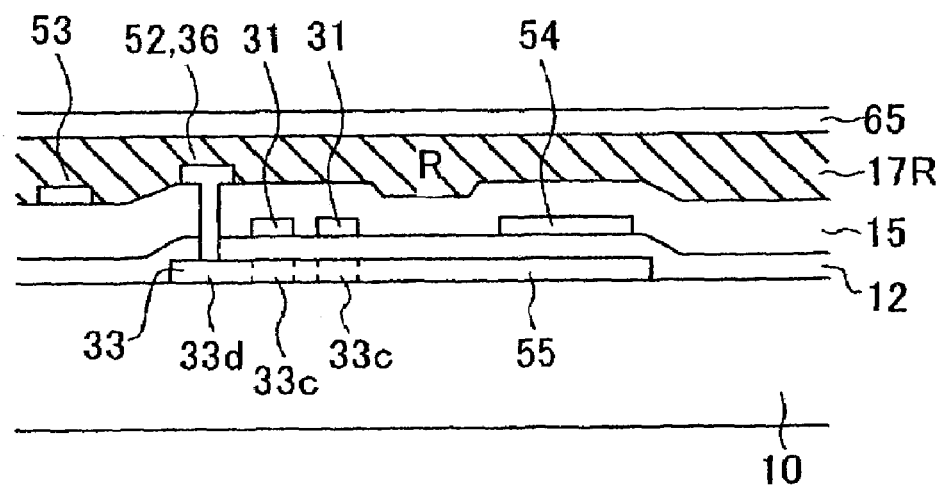
FIG. 5A is a cross-sectional view of the pixel of the organic EL display panel of a second embodiment of this invention.
Figure 5B:
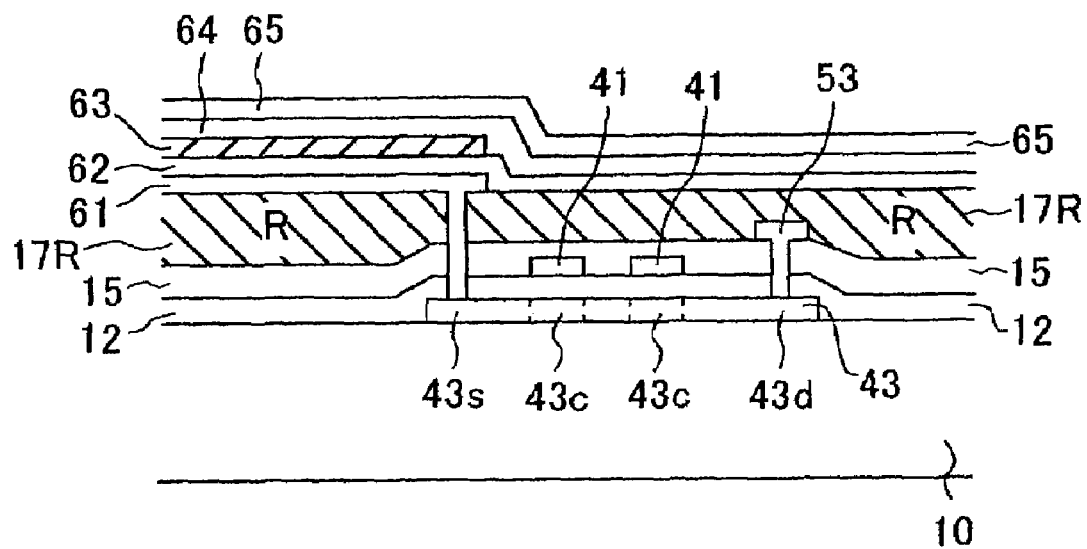
FIG. 5B is another cross-sectional view of the pixel of the organic EL display panel of the second embodiment.

A second embodiment of this invention will be explained by referring to FIGS. 5A and 5B. FIG. 5A is a cross-sectional view corresponding to A—A line, and FIG. 5B is a cross-sectional view corresponding to B—B line in FIG. 3. In FIGS. 5A and 5B, the same reference components as in FIGS. 4A and 4B are indicted by the same reference numerals.

In this embodiment, the planarization film 17R has the same color as that of the light generated by the emissive layer 63. For example, the planarization film 17R of the pixel with the emissive layer 63 radiating red (R) light has a red color. Likewise, the planarization film (not shown in the figure) of the neighboring pixel that has the emissive layer 63 of green (G) light has a green color, and the planarization film (not shown in the figure) of the pixel with emissive layer 63 of blue (B) light has a blue color.

For example, the red planalization film 17R is made of a photosensitive resin that includes a red-coloring material. The red planalization film 17R is formed by coating the photosensitive resin containing a red-coloring material. Then, the photosensitive resin in the area corresponding to the row of R pixels is preserved through photo lithography method, making red stripes. The green and blue planalization films can be formed in the same manner.

Therefore, even if the cathode layer 65 reflects light, the reflected light will be the same color as that of the light of the emissive layer 63 because the reflected light radiates outwards through the insulating substrate 10 and the planarization film 17R. The contrast of display will be improved.

The anti-reflection layer 7 is formed in the first embodiment for preventing the reflection of light coming from the backside of the device glass substrate 1, and the planarization film 17 is colored with the same color as that of the light from the emissive layer in the second embodiment. It is also possible to combine those configurations. That is, the combination of the anti-reflection layer 7 and the coloring of the planarization film 17 with the similar color to that of the light from the emissive layer will further improve the display contrast. For example, the anti-reflection layer can suppress the reflection of light, but the light will be somewhat reflected unless the reflectivity of the layer is 0%. However, the reflected light radiates outwards from the insulating substrate 10 through the planarization film 17R, which make the color of light same as that of the emissive layer 63, in the combination of the first and the second embodiments, improving the display contrast.

Figure 6A:
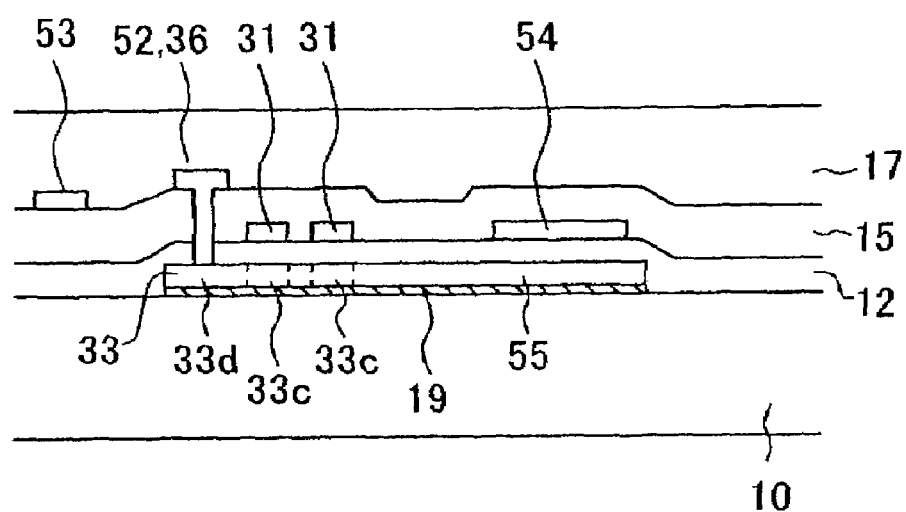
FIG. 6A is a cross-sectional view of the pixel of the organic EL display panel of a third embodiment of this invention.
Figure 6B:
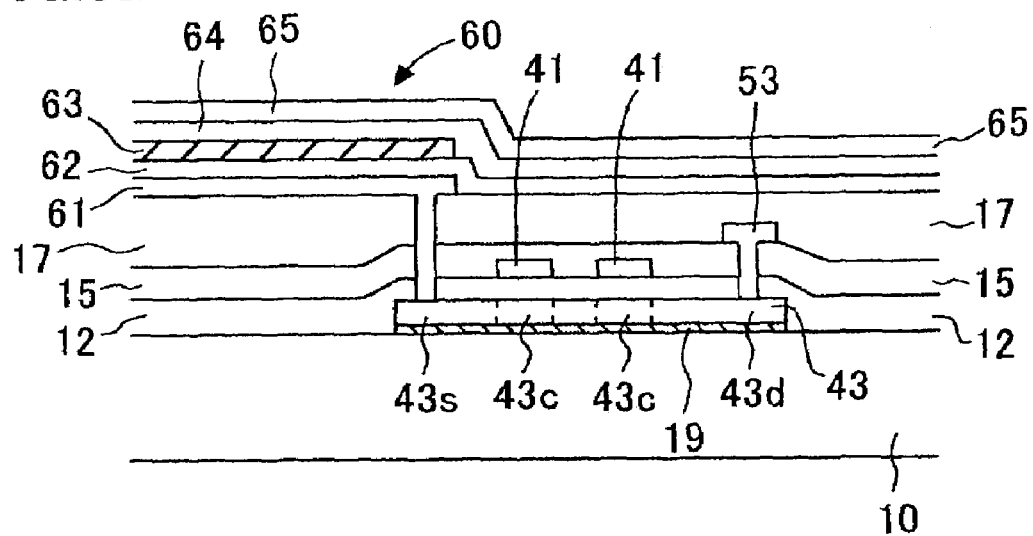
FIG. 6B is another cross-sectional view of the pixel of the organic EL display panel of the third embodiment.

The third embodiment of this invention will be explained by referring to FIGS. 6A and 6B. FIG. 6A is a cross-sectional view corresponding to A—A line, and FIG. 6B is a cross-sectional view corresponding to B—B line in FIG. 3. In FIGS. 6A and 6B, the same reference components as in FIGS. 4A and 4B are indicted by the same reference numerals.

The anti-reflection layer 18 of the first embodiment is formed for preventing the reflection of light coming from the backside of the device glass 1. Therefore, the anti-reflection layer may be formed anywhere on the device glass under the cathode layer except the region corresponding to the emissive layer 63. In this embodiment, a chromium oxide layer 19 (CrO layer) is formed under the switching TFT 30 and the driving TFT 40. The chromium oxide layer 19 is disposed on the insulating film by sputtering or evaporation method, and then patterning is performed to leave the chromium oxide layer at least in the regions of the switching TFT 30 and the driving TFT 40. Then, the active layers 33 and 43 made of poly-silicon film are formed on the chromium oxide layer 19 through the method described above. Although the preferable thickness of the chromium oxide layer 19 is about 500 Å, the thickness is not limited to this particular number.

The chromium oxide layer 19 works as the anti-reflection layer that prevents the reflection of light coming from the backside of the device glass 1. In addition, the chromium oxide layer 19 also functions as a light-blocking layer that blocks the incoming light to the active layers 33, 43 of the switching TFT 30 and the driving TFT 40, preventing the photo-current from passing through the switching TFT 30 and the driving TFT 40.

If there is no light-blocking layer, the active layers 33, 43 of the switching TFT 30 and the driving TFT 40 will be irradiated by the light from the backside of the device glass 1, forming carriers in the active layers 33 and 43 due to the energy of the light. The photo current will pass through between the source and the drain, even if the switching TFT 30 and the driving TFT 40 are off, deteriorating the display contrast. The chromium oxide layer 19 described above can prevent the generation of photo current, further improving the display quality.

The bottom emission type organic EL device, in which light for the display from the organic EL element 60 passes through the device glass substrate having the switching TFT 30 and the driving TFT 40 thereon, is used as an example to explain the embodiment described above.

Figure 7A:
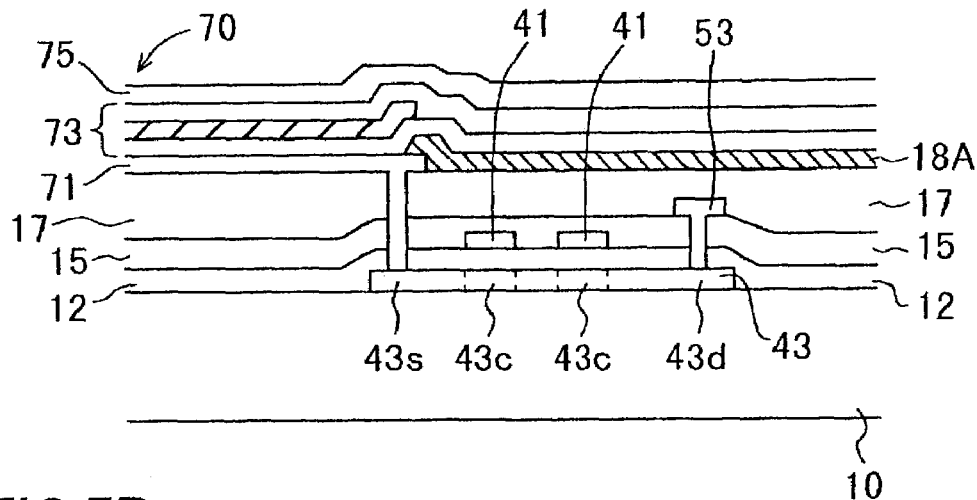
FIGS. 7A, 7B and 7C are cross-sectional views of the pixel of a top-emission type organic EL display panel as a modification to the first through third embodiments.

However, these embodiments are not limited to the bottom-emission type organic EL device. They are also applicable to the top-emission type organic EL device, where light from the organic EL element 60 comes out from the opposite side of the display device, i.e., light does not pass through the device glass substrate 1. FIG. 7A is a cross-sectional view of a top-emission type organic EL device. In FIG. 7A, the same reference components as in FIGS. 4A and 4B are indicted by the same reference numerals. Redundant descriptions are omitted.

The organic EL element 70 has the anode layer 71, an organic layer 73 including the hole transportation layer, the emissive layer and the electron transportation layer, and the cathode layer 75. Since the light radiates from the organic layer 73 upwards, the cathode layer 75 is made of a transparent or translucent electrode material. The anode layer 71 is typically made of a metal material that reflects light. However, it is also possible to use a transparent electrode material such as ITO or to combine these materials for forming the anode layer 71.

The anti-reflection film 18A is formed above the anode layer 71 or above the cathode layer 75 (the side from which light radiates), that is, it is formed at least above the anode layer 71. The anti-reflection film 18A covers the edge of the anode layer 71 and extends over the planarization film 17.

The anti-reflection film 18A prevents the reflection of light by the edge of the anode layer 71, and works also as the planarization layer, improving the coverage of the organic layer 73.

The anti-reflection film 18A may be formed immediately under the anode layer 71 when the anode layer 71 is made of a transparent electrode material. Furthermore, the anti-reflection film 18A may be formed on the surface of the sealing glass substrate 4 facing the organic EL element 70 to cover the edge of the anode layer.

Figure 7B:
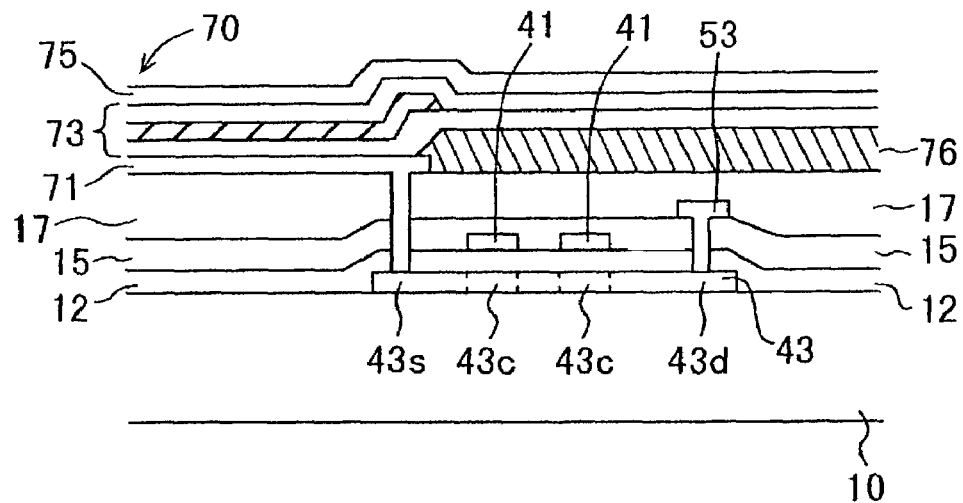

The second planarization layer 76 is colored with the same color as that of the light emitted from the organic layer 73 as is the case with the second embodiment, as shown in FIG. 7B. This second planarization film 76 is formed so as to limit the surface area of the anode layer 71 touching with the organic layer 73.

Figure 7C:
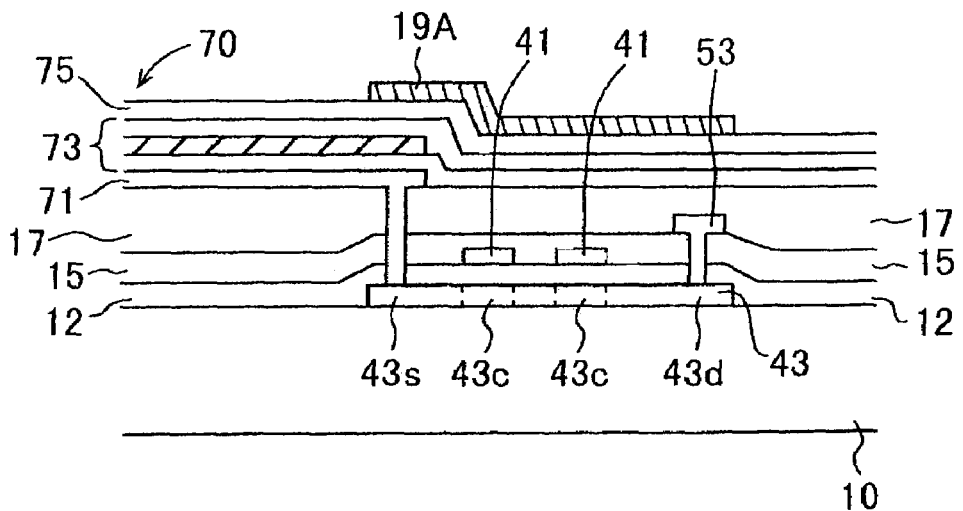

Additionally, the light-blocking layer 19A is formed on the cathode layer 75 above the driving TFT 40, as shown in FIG. 7C. Although it is not shown in the figure, the light-blocking layer 19A is also formed above the switching TFT 30. The light-blocking layer 19A is made of, for example, chromium oxide. As in the third embodiment, the chromium oxide layer 19A has the anti-reflection effect and prevents the photo current from going through the switching TFT 30 and the driving TFT 40.

The anode layer 71 is formed below the cathode layer 75 in FIGS. 7A, 7B, and 7C. However, the related positioning of the anode layer 71 and the cathode layer 75 may be reversed.

What is claimed is:

1. An electroluminescent display device comprising:
    an insulating substrate;
    a first electrode layer disposed over the insulating substrate;
    an emissive layer disposed over the first electrode layer;
    a second electrode layer covering the emissive layer; and
    a colored layer disposed over the insulating substrate and having a substantially same color as light emitted from the emissive layer,
    wherein the colored layer is in contact with an edge portion of a top surface of the first electrode layer so that external light reflecting from the edge portion of the first electrode layer in contact with the colored layer possesses the same color as the colored layer, and
    the electroluminescent display device is configured to emit light for display toward a side opposite from the insulating substrate.

2. The electroluminescent display device of claim 1, further comprising a thin film transistor formed on the insulating substrate, wherein the colored layer is disposed on the thin film transistor.

3. The electroluminescent display device of claim 1, wherein the colored layer comprises a photosensitive resin including a material of the same color.

* * * * *